Feb. 14, 1961 W. E. TAYLOR 2,971,869

SEMICONDUCTOR ASSEMBLY AND METHOD OF FORMING SAME

Original Filed Feb. 10, 1954

INVENTOR.
William E. Taylor
BY
Mueller & Aichele
Attys.

United States Patent Office 2,971,869

Patented Feb. 14, 1961

2,971,869

SEMICONDUCTOR ASSEMBLY AND METHOD OF FORMING SAME

William E. Taylor, Phoenix, Ariz., assignor to Motorola, Inc., Chicago, Ill., a corporation of Illinois Continuation of application Ser. No. 409,339, Feb. 10, 1954. This application Aug. 27, 1957, Ser. No. 680,601

8 Claims. (Cl. 148—1.5)

The present invention relates to transistors, and more particularly an improved transistor of the junction type and to an improved and simplified method for fabricating such a transistor.

This is a continuation of copending application Serial No. 409,339, filed February 10, 1954, now abandoned.

Junction type transistors are known in which a semiconductor crystal wafer composed, for example, of germanium, has a metal impurity alloyed into each of its opposite faces to form p-n junctions within the crystal. The alloying is usually carried out in a hydrogen atmosphere furnace, in which indium pellets, for example, are fused to the opposite faces of an n-type germanium wafer. The temperature is then raised to the alloying point of the indium and germanium to form the respective p-n junctions within the crystal wafer. During the alloying process, the fused metal corrosively attacks the surface of the semi-conductor wafer forming cavities, and this attack continues until the liquid metal becomes saturated with the semi-conductor at the alloying temperature. During the cooling of the assembly, the semi-conductor contained in the liquid metal is precipitated within the semi-conductor wafer carrying with it some of the alloying metal. This causes the formation of p-type semi-conductive material, and resulting p-n junctions, within the wafer adjacent the cavities formed by the corrosive process and conforming in shape with the respective surfaces of these cavities.

The method described above produces a p-n-p transistor unit and similar methods are known for forming n-p-n transistors; in the latter methods, a p-type germanium semi-conductor crystal is used, and is alloyed with an n-type metal impurity, such as a binary tin antimony alloy.

The high frequency response of the junction type transistor is limited by factors which may be classified as (*a*) input circuit effects and (*b*) those effects associated with transit time dispersion. The present invention is concerned with the latter effects, and its general purpose is to increase the high frequency cut-off point of a junction type transistor by reducing the transit time dispersion.

The designation "transit time" refers to the time required for a charge carrier to move from the emitter junction to the collector junction of a transistor unit. This motion of the charge carriers is by a diffusion process, that is, by an essentially random process with the individual carrier making many collisions and changing direction of motion many times during its travel across the base region. This produces a dispersion of the transit time which limits the frequency response of the transistor.

Dispersion of the transit time, with resulting limitation on the frequency response characteristics of the transistor, also rises when the individual carriers have different path lengths. This is caused by non-planar geometries of the unit and end effects. The present invention is directed particularly to the formation of p-n junctions in the crystal wafer which are essentially flat and in mutually parallel planes, thereby reducing the variations in individual path lengths for the individual carriers and the adverse results arising therefrom.

The shape of the cavity on each face of the crystal wafer produced during the alloying process by the corrosive attack of the alloying metal determines the shape of each of the p-n junctions. As noted above, it is desirable that this shape be flat and that the two junctions be formed in planes that are essentially parallel to one another. It is to be expected that the shape of each cavity would be determined by surface tension and would be a curved surface to provide a minimum of surface consistent with the enclosure of the existing volume. However, the present invention provides a simple means whereby the surfaces of the cavities, and the corresponding p-n junctions, have a desired substantially flat shape and are disposed in essentially parallel planes.

The semi-conductor crystal consists of atoms arranged in a pattern which repeats itself periodically in three dimensions. The atomic arrangement in the crystal is conveniently described with a three dimensional lattice of straight lines. To specify a given arrangement of points in a space lattice or crystal structure, it is customary to define their co-ordinates with respect to a set of axes having an origin at one of the lattice points. A cubic system has been devised, which is applicable to the crystallographic structure of semi-conductor crystals such as germanium and silicon, and in such system the coordinates of the various points are referred to a set of axes which are mutually perpendicular. Considering the crystal structure of these semi-conductors, one can see that all the spaces within the crystal are filled by cubic prisms whose edges are parallel to the cubic axes.

In the semi-conductor crystals referred to above, each cubic prism structure cell is defined by atoms which are located at each corner of the cube, in the center of each face of the cube, and within the cube along the diagonals thereof. It is apparent that in such a crystal structure the atoms lie in planes. One set of such planes are those defined by the cube faces and another is defined by those passing diagonally through the cube. There are actually two series of the latter sets, one series passing through two edges of the cube and one passing through three corners of the cube. These planes are conveniently identified by a system of notation in which a term "Miller Indices" is applied.

The length of the cube edge is an important characteristic of the structure and is called the lattice parameter. The Miller Indices are based on the intercepts of a plane with the three crystal axes (three edges of the structure cell), and the intercepts are measured in terms of lattice parameter. That is, a plane which cuts the X-axes at a distance from the origin (taken at one of the cube corners) equal to 1/3 of the lattice parameter is said to have an X-intercept of 1/3. Similarly, if the plane cuts the Y-axes at a distance from the origin equal to 1/2 the lattice parameter, it is said to have a Y-intercept of 1/2; and if the plane cuts the Z-axes at a distance from the origin equal to the lattice parameter, it is said to have a Z-intercept of 1/1. To indicate this plane by Miller Indices, the three fractions $$\frac{1}{1/3}, \frac{1}{1/2} \text{ and } \frac{1}{1/1}$$

are reduced to fractions having the lowest common denominator, that is, 3/1, 2/1, and 1/1. The Miller Indices are then given by the numerators, namely (321).

In the present specification and claims, reference will be made to crystallographic planes in a semi-conductor crystal having Miller Indices of (111). This refers to a set of parallel planes throughout the crystal structure which, in each lattice cube, intercept the three crystal axes at a distance from the origin equal to the lattice parameter. In accordance with the present invention, the alloying metal is fused to faces of the crystal parallel to these planes to provide cavities and corresponding p-n junctions that are flat rather than curved in shape.

It is, accordingly, an object of the present invention to provide an improved transistor unit constructed to exhibit an improved high frequency response characteristic with respect to similar units previously known to the art.

Another object of the invention is to provide an improved and simplified process for producing junctions in a transistor crystal that are substantially flat and lie in essentially parallel planes so as to improve the high frequency response characteristic of the transistor unit.

A feature of the invention is the fusing of alloying metals on faces of a semi-conductor crystal wafer, which faces are essentially parallel to the Miller Indices (111) crystallographic planes of the semi-conductor crystal.

The above and other features of the invention which are believed to be new are set forth with particularity with appended claims. The invention itself, however, together with further objects and advantages thereof had best be understood by reference to the following description when taken in conjunction with the accompanying drawing in which:

Figures 1, 2, 3:
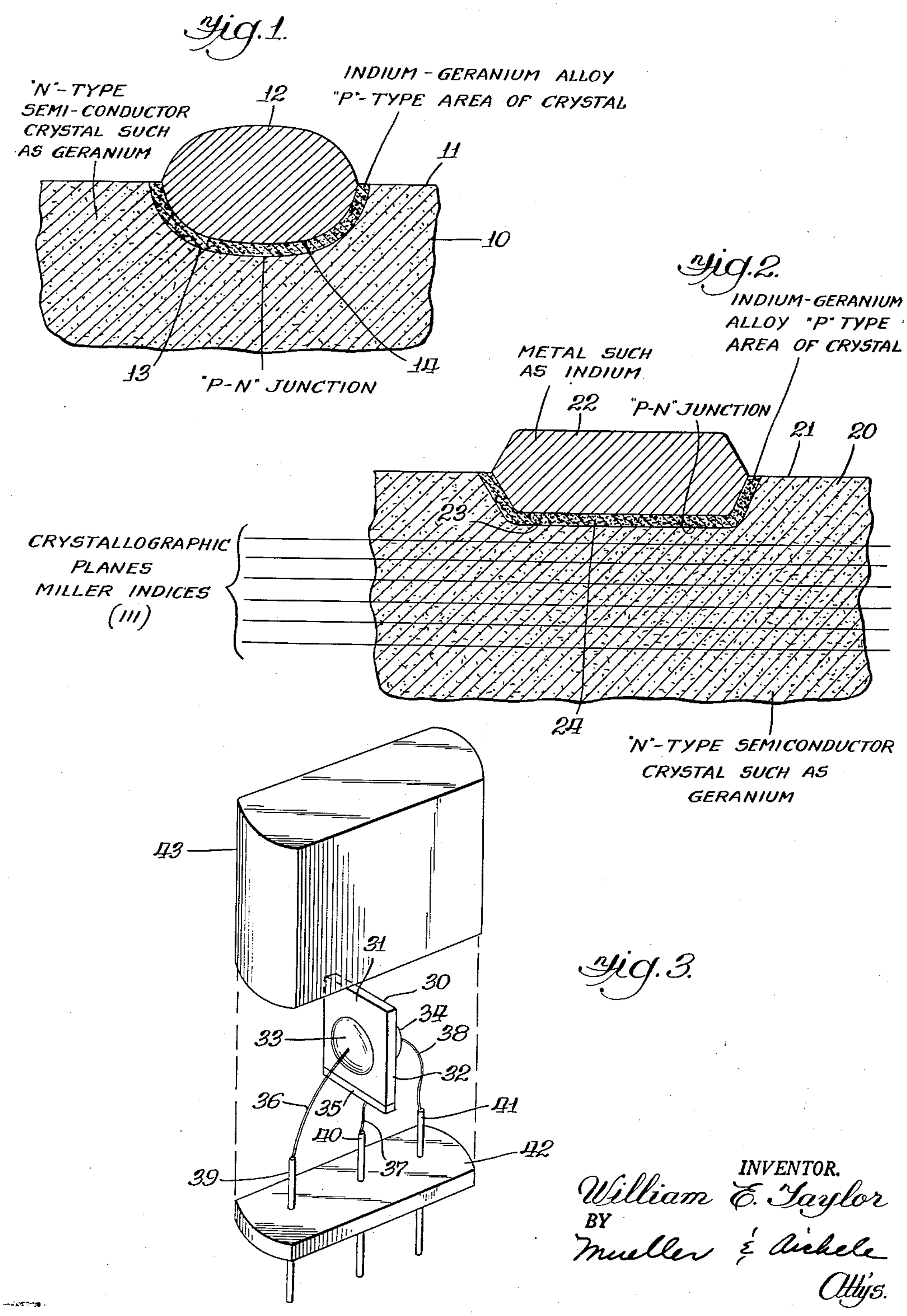
Fig. 1 is a schematic representation of an alloying metal fused to a face of a semi-conductor crystal in accordance with the prior art practice.
Fig. 2 is a schematic representation of such a metal fused to a face of the crystal in accordance with the present invention.
Fig. 3 shows a junction type transistor unit constructed in accordance with the present invention.

The present invention provides a transistor unit which comprises a semi-conductor crystal block having a pair of opposite faces disposed essentially parallel to the crystallographic Miller Indices (111) planes of the crystal block. A pair of cavities is respectively formed in these opposite faces of the crystal block, and these cavities have essentially flat surfaces substantially parallel to the aforesaid (111) crystallographic planes of the crystal block. A pair of metallic members is respectively disposed within the cavities and fused to the respective surfaces thereof, and an alloy area extends into the crystal block from the surface of each of the cavities and defines a substantially flat planar junction within the crystal block disposed in a plane essentially parallel to the surface of the corresponding one of the cavities.

The formation of junction type transistor units by fusing an alloying metal to the opposite faces of a semi-conductor crystal wafer is, as previously pointed out, well known. For example, a p-n-p germanium-indium transistor unit may be constructed in the following manner:

n-type germanium wafers are cut and then surface ground and etched in a suitable etching solution to impart the desired electrical characteristics to the wafer. The etching also provides the proper cleanliness to the surface to facilitate the wetting of the crystal by the metal that is to be fused and alloyed therewith.

The wafer is then placed in a jig composed of graphite or other suitable substance, and an indium pellet that is to form the collector electrode is located at the appropriate place on one face of the wafer by a graphite washer. The assembly is then fired in a furnace to melt the indium and start its alloying with the germanium. The germanium wafer is then turned over and a second indium pellet is placed on its opposite face and the procedure is then repeated so that the latter pellet is also bonded to the germanium and subsequently forms the emitter electrode of the transistor. The assembly is then fired at an alloying temperature so that the two faces of the germanium crystal may be corrosively attacked by the indium to form cavities and p-type areas in the manner previously described herein.

With reference now to Fig. 1, there is shown a prior art junction formed in a crystal wafer when no consideration is given to the orientation of the crystal. The representation of Fig. 1 includes a semi-conductor crystal 10 which, for example, may be an n-type germanium wafer. This wafer has a face 11 on which a disc 12 of, for example, p-type metal such as indium, is fused. The fusing of the indium causes a cavity 13 to be formed in face 11 and produces a p-type area 14 within crystal 10 conforming to the surface of the cavity. As previously described, the surface of cavity 13 normally has a curved surface to provide a minimum surface consistent with the enclosure of the existing volume. This, however, as previously described produces unequal path lengths for the individual charge carriers with resulting adverse effects on the high frequency response of the crystal.

In accordance with the present invention, and as shown in Fig. 2, the crystal wafer 20 is cut so that its face 21 is disposed parallel to the crystallographic Miller Indices (111) planes of the crystal structure.

It has been found that when the crystal is so oriented, the corrosive attack of the alloying metal 22 produces a cavity 23 having a flat surface essentially parallel to the aforesaid crystallographich planes. Moreover, the p-type area 24 formed during the alloying process conforms with the surface of cavity 23 and forms a p-n junction with crystal 20 that is also substantially flat and lies in a plane parallel to the aforesaid crystallographic planes.

It is evident that when crystal 20 is in the form of a flat wafer, and when the alloying metal is formed on its opposite faces in the manner previously described herein, that a pair of p-n junctions is formed on opposite sides of the crystal which are essentially flat and disposed in substantially parallel relation with one another.

The transistor unit shown in Fig. 3 is constructed to include a crystal wafer 30 having a pair of opposing faces 31, 32 disposed essentially parallel to the crystallographic Miller Indices (111) planes of the crystal block. The unit includes an emitter electrode 33 and a collector electrode 34 respectively disposed on the opposite faces and fused thereto in the manner previously described herein to form appropriate junctions within the crystal.

A metallic tab 35 is soldered to the bottom of crystal 30 and forms the base electrode. Wire leads 36, 37 and 38 respectively connect the electrodes of the crystal to pins 39, 40 and 41. Pins 39–41 may be mounted in spaced relation on an insulating base 42 to extend through the base. A suitable cover 43 is provided, and the unit may be imbedded in an appropriate potting compound within the cover.

As previously noted, the technique of this invention has also been applied in the formation of n-p-n junction transistors. Highly favorable results have been obtained when a tin-antimony alloy (about 95% tin and 5% antimony—by weight) is fired on a P-type germanium crystal with the crystal oriented so that the (111) planes are parallel to the surfaces on which the alloy is fused. Other tin alloys containing, for example, 5–10% phosphorus, arsenic, bismuth or the like, may also be used.

The invention provides, therefore, an improved junction transistor unit which is constructed so that the junctions within the transistor crystal lie in flat planes that are essentially parallel to one another. In this manner, the transit time dispersion due to unequal path lengths for the individual carriers is minimized, and the adverse effect of transit time dispersion on the high frequency characteristics of the transistor is substantially reduced.

While a particular embodiment of the invention has been shown as described, modifications may be made, and it is intended in the appended claims to cover all such modifications as fall within the true spirit and scope of the invention.

I claim:

1. The method of fabricating an alloyed junction semiconductor assembly so as to provide at least one junction in a semiconductor crystal element in such assembly which junction is substantially parallel to a predetermined crystallographic (111) plane within such element, which method includes the steps of preparing a semiconductor crystal element having at least one face which is known to be oriented substantially parallel to a (111) crystallographic plane within the element, providing an impurity body at said face and in contact therewith, alloying said impurity body to said element at said face by subjecting said element and said impurity body to heat of a temperature such that said impurity body and the portion of the semiconductor crystal element adjacent thereto alloy to one another to form a junction therein with said semiconductor crystal element, said junction being substantially planar in configuration over at least a portion thereof and with said latter portion being substantially parallel to said (111) plane as a result of having the adjacent face of the semiconductor crystal element substantially parallel to said (111) plane within said element.

2. The method of fabricating an alloyed junction semiconductor assembly so as to provide at least two junctions in the semiconductor crystal element in such assembly which junctions are substantially parallel to a predetermined crystallographic (111) plane within such element, which method includes the steps of preparing a semiconductor crystal element having oppositely disposed faces which are known to be oriented substantially parallel to a (111) crystallographic plane within the element, providing an impurity body at each said face and in contact therewith, alloying said impurity bodies to said element at said faces by subjecting said element and said impurity bodies to heat of a temperature such that said impurity bodies and the portion of the semiconductor crystal element adjacent thereto alloy to one another to form a pair of junctions therein with said semiconductor crystal element, each said junction being substantially planar in configuration over at least a portion thereof and with said latter portion of each junction being substantially parallel to said (111) plane as a result of having the corresponding face of the semiconductor crystal element oriented substantially parallel to said (111) plane within said element and having said faces of said semiconductor crystal element substantially parallel to one another.

3. The method of fabricating an alloyed junction semiconductor assembly for use in a semiconductor device and fabricating it so as to provide at least two oppositely disposed junctions in the semiconductor crystal element in such assembly and provide such junctions so as to be substantially parallel to a predetermined crystallographic (111) plane within such element, which method includes the steps of preparing a semiconductor crystal element having oppositely disposed faces which are known to be oriented substantially parallel to a (111) crystallographic plane within the element, providing an impurity body at each said face and in contact therewith and oppositely disposed to one another, alloying said impurity bodies to said element at said faces by subjecting said element and said impurity bodies to heat of a temperature such that said impurity bodies and the portion of the semiconductor crystal element adjacent thereto alloy to one another to form a pair of junctions therein with said semiconductor crystal element, each said junction being substantially planar in configuration over at least a portion thereof and with said latter portion of each junction being substantially parallel to said (111) crystallographic plane as a result of having the corresponding face of the semiconductor crystal element oriented substantially parallel to said (111) plane within said element and having said faces of said semiconductor crystal element substantially parallel to one another.

4. A semiconductor assembly of the type having at least one alloyed junction, said assembly including in combination a semiconductor crystal element with a face thereof known to be oriented substantially parallel to a crystallographic plane within the crystal element identified by Miller Indices (111), at least one electrode at said face of said element which is alloyed thereto, an alloyed region extending into said semiconductor crystal element from said face and said electrode, said alloyed region having a junction formed between the innermost portion thereof and the adjacent region within the semiconductor crystal element, said junction having a substantially flat portion which is substantially parallel to the (111) crystallographic plane within the semiconductor crystal element and which is substantially parallel to said face.

5. A semiconductor assembly for a semiconductor device, said assembly including in combination a semiconductor crystal element having two opposite faces which are each known to be oriented substantially parallel to a crystallographic plane within the crystal element identified by Miller Indices (111), at least one electrode at each said face of said element and alloyed thereto, at least two alloyed regions with each extending into said semiconductor crystal element from a corresponding face and corresponding electrode, with each said alloyed region having a junction formed between the innermost portion thereof and the adjacent region within the semiconductor crystal element, said junctions each having a substantially flat portion which is substantially parallel to the (111) crystallographic plane within the semiconductor crystal element and which is substantially parallel to the corresponding face, and with said substantially flat portions of said junctions being substantially parallel to one another.

6. A semiconductor assembly in a semiconductor device of the alloyed junction type, said assembly including in combination a semiconductor crystal element having two opposite faces which were originally identified in the preparation of the element as being substantially parallel to a crystallographic plane within the crystal element designated by Miller Indices (111) and which are each known to be so oriented, at least one electrode at each said face of said element oppositely disposed thereon and alloyed thereto, an alloyed region corresponding to each electrode and extending into said semiconductor crystal element from a corresponding face and corresponding electrode, with each said alloyed region having a junction formed between the innermost portion thereof and the adjacent region within the semiconductor crystal element, said junctions each having a substantially flat portion which is substantially parallel to the (111) crystallographic plane within the semiconductor crystal element and which is substantially parallel to the corresponding face, and with said substantially flat portions of said junctions being substantially parallel to one another.

7. The method of fabricating an alloyed junction semiconductor assembly having a semiconductor crystal element in such assembly so as to provide at least two junctions therein which are substantially parallel to a predetermined crystallograph (111) plane within such element, which method includes the steps of separating from a semiconductor crystal a semiconductor crystal element which has oppositely disposed faces known to be oriented so as to be substantially parallel to a (111) crystallographic plane within the semiconductor crystal element, providing an impurity body at each said face, alloying said impurity bodies to said element at said faces so as to form a pair of junctions within said semiconductor crystal element which are each substantially planar in configuration over at least a portion thereof, with said latter portion of each junction being in a position within the crystal element substantially parallel to said (111) plane, and with said positions of said junctions being the result of having the said faces of the semiconductor crystal element originally oriented substantially parallel to said (111) plane within said element and having said faces of said semiconductor crystal element substantially parallel to one another.

8. In a transistor, the combination including a mounting, a semiconductor assembly on said mounting with a semiconductor crystal element having two opposite faces which are each known to have been originally oriented so as to be substantially parallel to a crystallographic plane within the crystal element identified by Miller Indices (111), at least one electrode at each said face of said element and alloyed thereto, at least two alloyed regions with each said region extending into said semiconductor crystal element from a corresponding face and corresponding electrode, with each said alloyed region having a junction formed between the innermost portion thereof and the adjacent region within the semiconductor crystal element, said junctions each having a substantially flat portion which is substantially parallel to the (111) crystallographic plane within the semiconductor crystal element and which is subtantially parallel to the corresponding face from which the alloyed region therefor extends, and with said substantially flat portions of said junctions being substantially parallel to one another.

References Cited in the file of this patent

UNITED STATES PATENTS

| | | |
|---|---|---|
| 2,505,633 | Whaley | Apr. 25, 1950 |
| 2,697,052 | Dacey | Dec. 14, 1954 |
| 2,742,383 | Barnes et al. | Apr. 17, 1956 |
| 2,802,159 | Stump | Aug. 6, 1957 |
| 2,850,413 | Schmich | Sept. 2, 1958 |
| 2,858,730 | Hanson | Nov. 4, 1958 |
| 2,894,862 | Mueller | June 14, 1959 |

OTHER REFERENCES

Wynne and Goldberg: Journal of Metals, page 436, March 1953.

Ellis: Journal of Applied Physics, December 1954, pages 1497–99.